(12) United States Patent
Schweigert

(10) Patent No.: US 11,940,472 B2
(45) Date of Patent: Mar. 26, 2024

(54) METHOD FOR CHECKING LOAD CIRCUITS IN A TECHNICAL INSTALLATION

(71) Applicant: Siemens Aktiengesellschaft, Munich (DE)

(72) Inventor: Harald Schweigert, Vienna (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 29 days.

(21) Appl. No.: 17/638,581

(22) PCT Filed: Aug. 25, 2020

(86) PCT No.: PCT/EP2020/073716
§ 371 (c)(1),
(2) Date: Feb. 25, 2022

(87) PCT Pub. No.: WO2021/037835
PCT Pub. Date: Mar. 4, 2021

(65) Prior Publication Data
US 2022/0299548 A1 Sep. 22, 2022

(30) Foreign Application Priority Data
Aug. 29, 2019 (EP) ...................................... 19194259

(51) Int. Cl.
*G01R 19/165* (2006.01)
(52) U.S. Cl.
CPC ................................ *G01R 19/1659* (2013.01)
(58) Field of Classification Search
CPC .................................................. G01R 19/1659
See application file for complete search history.

(56) References Cited

U.S. PATENT DOCUMENTS

| | | | |
|---|---|---|---|
| 2014/0159482 A1* | 6/2014 | Satake | H02J 7/14 307/11 |
| 2021/0042570 A1* | 2/2021 | Iskandar | G06F 11/3075 |

FOREIGN PATENT DOCUMENTS

| | | | |
|---|---|---|---|
| DE | 112016003869 | * | 5/2018 |
| DE | 102018114094 | | 5/2019 |

(Continued)

OTHER PUBLICATIONS

PCT International Search Report dated Nov. 18, 2020 based on PCT/EP2020/073716 filed Aug. 25, 2020.

*Primary Examiner* — Feba Pothen
(74) *Attorney, Agent, or Firm* — Cozen O'Connor

(57) ABSTRACT

Method for checking load circuits of a control system in an installation, wherein the system includes load circuits with a load unit, a control unit and a clocked power supply that supplies the load circuits with a supply voltage or a supply current via output channels activated by control signals from the control unit, where reference values for currents or voltages are initially determined for predefined installation states in which an output channel is activated and an associated load circuit is supplied with predefined voltage values of the supply voltage or predefined current values of the supply current, reference values determined for the predefined installation states are stored, during a self-test present current values or voltage values on the activated output channel are subsequently measured, and a check is performed, and the corresponding associated load circuit is indicated if a deviation from a tolerance range exists.

17 Claims, 1 Drawing Sheet

(56) References Cited

FOREIGN PATENT DOCUMENTS

EP          1837971        9/2007
EP          2313952        4/2011

\* cited by examiner

METHOD FOR CHECKING LOAD CIRCUITS IN A TECHNICAL INSTALLATION

CROSS-REFERENCE TO RELATED APPLICATIONS

This is a U.S. national stage of application No. PCT/EP2020/073716 filed 25 Aug. 2020. Priority is claimed on European Application No. 19194259.8 filed 29 Aug. 2019, the content of which is incorporated herein by reference in its entirety.

BACKGROUND OF THE INVENTION

1. Field of the Invention

The present invention generally relates to the field of electrical engineering, in particular to the field of power electronics and power electronics circuits and, more specifically, to a method for checking load circuits of a control system in a technical installation, where the control system comprises, in addition to at least two load circuits, at least one control unit and a clocked power supply, where the at least two load circuits, which each have at least one load unit (for example sensor, actuator, relay, contactor, solenoid valve, servomotor, etc.), are supplied with a supply voltage and/or a supply current by the clocked power supply, where to this end, the at least two load circuits are connected to at least two output channels that are formed either by at least two direct outputs of the power supply or by two externally connected and separately switchable output branches, and where control signals are made available by the control unit to actuate the at least two output channels.

PRIOR ART

2. Description of the Related Art

Complex machines and/or installations are nowadays used in many fields, such as in industrial production and manufacture, in energy generation and distribution, in automation engineering, and/or in building management. Here, an installation is understood to mean a methodical composition of components (for example, machines, devices and/or apparatuses) that are spatially related and linked to one another in terms of function, control and/or safety. Such technical installations, such as production installations, manufacturing installations, energy generation and/or energy distribution installations, and their components are becoming increasingly complex. To efficiently operate technical installations and complex machines, use is therefore usually made of control systems, in which operating parameter values or process parameter values of the installation or machine are measured by sensor units or measuring units, and actuator units or load units (for example, contactors, solenoid valves, optical or acoustic warning signals, motor units, and/or display units) are actuated based on the measured operating parameter values or process parameter values, in order, for example, to amend operating or process parameters. The control system is intended to make the operation of the machine or installation as independent as possible and independent of human interventions.

In order to evaluate the measured values from the sensor units or measuring units and to actuate the actuator units (for example, servomotor, warning signal, and/or display unit), the control system usually has a control unit. The control unit may furthermore be used, for example, depending on the process engineering requirements, to switch in or switch out different load units, such as contactors, solenoid valves actuated via an electromagnet. By way of example, what is known as a programmable logic controller or PLC, a microcontroller or an industrial PC may be used as control unit.

Such a control system furthermore has at least one clocked power supply (such as a switched-mode power supply), via which an unstable input voltage (usually an AC voltage) is converted into a constant output voltage (usually a DC voltage (for example, 24 volts)) in order to supply the load units of the control system. Such a power supply (such as the SITOP PSU8600 from Siemens) may, for example, have at least two or more outputs for the direct connection of load circuits, where these outputs are used as output channels and can be actuated via control signals from the control unit. As an alternative, it is possible to use a clocked power supply to which, for example, an assembly (for example, switchable fuse unit) can be connected via an output of the power supply. At least two separately switchable output branches are then, for example, made available as output channels by this assembly. A load circuit containing at least one load or load unit or containing a group of load units may be connected to each of the output channels. The load or the load circuit is then supplied, via the respective output channel, with a supply voltage (for example, 24 volts) and/or a supply current that is made available by the power supply. In order to actuate the output channels (i.e., in order to activate or deactivate the voltage supply and/or current supply of a load circuit) control signals may, for example, be made available to the power supply by the control unit or the control unit may actuate the output channels and influence the supply voltage or the supply current in the output channels (i.e., the supply voltage or the supply current for the respectively connected load circuit).

In the case of the power supply with at least two output channels, the voltage and current may, for example, be set and monitored individually for each output channel. Thus, for example, the respective supply or load current or alternatively also the voltage for the respectively connected load circuit may be measured and monitored at each output channel. A current consumption in the respective load circuit or a present voltage may thereby, for example, be ascertained, where the current consumption or the voltage in the respective load circuit may change due to the control and switching operations performed by the control unit of the control system. In other words, switching in and switching out load units (such as contactors or solenoid valves) in accordance with process engineering requirements in the installation or machine may change the respective current consumption in the respective load circuit.

Following installation, or expansion, or when commissioning a complex machine or installation, checking for errors constitutes an essential aspect to guarantee frictionless and reliable operation. It is particularly important to promptly identify what are known as wiring errors in the installation or in the control system of the installation (i.e., errors in connecting one or more load units to a load circuit or an output channel of the power supply) in order to allow correct processes in the installation or machine and to protect load units, especially sensors and/or actuator units, against damage and destruction.

One conventional method for checking wiring is, for example, what is known as the "wiring test" or "passage test" using a continuity tester before an installation is commissioned or in a test phase. A continuity tester is an electrical testing device that uses an optical or acoustic signal to display whether two points are electrically connected. A continuity tester may be used, for example, to check the individual connections between an output channel of the power supply and a load unit in a load circuit of the control system of the machine or installation (usually manually) for correct wiring. However, this method is not only very time-consuming, but also susceptible to errors particularly in the case of complex machines and/or installations containing multiple control system load circuits.

A further possibility for checking whether the wiring of the control system of an installation or machine has been performed correctly is, for example, automatic connection testers that are contact-connected to rows of terminals in a switching cabinet of the installation or the control system, such as via test combs, and then perform predefined checks on the connections in accordance with the circuit diagram of the installation. Such a connection tester is however relatively expensive to procure and requires, for example, a dedicated test program that must be honed to the installation or machine. The respective test program for the connection tester is in particular almost impossible to reuse, for example, in the case of expansions, and/or modifications to the installation or machine, or must be adapted at considerable expense. Furthermore, although the connection tester tests the connections in the installation, it does not test the functions of the connected installation components.

However, there is, for example, also the option of tracing wiring errors for the first time upon or during the commissioning of an installation or machine. When commissioning an installation or machine, one load circuit of the control system may, for example, be activated after another and the function of the load units respectively connected via the load circuit may be checked. However, this check occurs when there is already an operational supply voltage in the respective load circuit, where the respective load circuit is usually also only protected during operation. In the case of incorrect wiring of connected load units, such as sensor units or actuator units, potentially being present, this may thereby damage or destroy these units. Furthermore, it thereby takes a great deal of effort to identify the correctness of load units used in the installation or in the control system of the installation, for example, in the case of incorrect signals or installation malfunctions. In other words, for example, if an incorrect type of proximity switch has been installed or if, for example, a sensor has been assigned to an incorrect load circuit.

Also known, for example, is a modular power distribution and safety system for central monitoring of installations of decentralized design, such as the REX system from E-T-A Elektrotechnicshe Apparate GmbH. This system comprises at least one infeed module for connection to a clocked power supply and at least one safety module having one or two channels for the connection and protection of a load circuit. By way of example, dynamic installation information and measured values (for example, present voltage and current values in load circuits that are connected via one or more safety modules, and/or reason for tripping of a safety module) may be ascertained by the infeed module and read out by a superordinate control unit via a data connection. Furthermore, for example, a rated current and a limit value for a respective current value in the load circuit may be set in the safety modules. Therefore, although this current distribution and safety system may be used to identify extreme defects, such as short circuits in the wiring of a load circuit, short circuits or overcurrents in a load circuit (especially during ongoing operation of an installation), a wiring error that may lead to only small overcurrents or current drops in relation to a target state, and the use of incorrect load units in a load circuit (for example, incorrect type of proximity switch, and/or incorrectly assigned sensor or actuator, on the supply and/or signal side) are very difficult if at all possible to identify without targeted manual troubleshooting or data analysis by a user. Furthermore, the at least one safety module restricts the range of the supply voltage in the load circuit to a typical operating voltage range of the respective components, because the safety module can be activated only starting from an operating voltage of around 16 volts, for example, due to operating voltage monitoring. The system may furthermore lead to increased expenditure and costs, for example in terms of installation planning and maintenance, due to the modular design.

EP 2 313 952 B1 discloses an electrical installation and a method for operating this installation, where the installation comprises a supply circuit having at least one fixedly wired consumer that is protected via a protective apparatus. Here, maximum current measured values are each determined and stored by a control unit for observation time intervals in order to derive therefrom a limit value for adapting a trip parameter. Although the electrical installation and the associated method known from EP 2 313 952 B1 may be used to ensure that an unidentified excessively high deactivation value of the protective apparatus is adapted appropriately during initial commissioning and/or during ongoing operation and thereby the failsafety of the installation is increased, whether the at least one consumer or an associated load circuit is wired correctly is not identified.

DE 10 2018 114 094 B3 furthermore discloses an output module for an industrial controller and a method for performing industrial control. Here, the present current and voltage values of a connected load are acquired by an acquisition unit and processed in a computing unit using applications to ascertain physical states linked to the load (for example, temperature of the load, short-circuit, cable breakage and/or winding short-circuit identification, wear identification). For this purpose, the applications are selected from a set of applications and loaded via a program memory. An evaluation result is transmitted to a control unit, superordinate controller and/or an external data memory. Although defects, such as short circuits, cable breakages, and/or overheating, and the occurrence of wear on a load, in particular a valve coil, and/or a piezoactuator of a valve are identified during ongoing operation of an installation in industrial control and a method for performing industrial control disclosed in DE 10 2018 114 094 B3, provided that the corresponding application is available to evaluate presently recorded current and voltage values, wiring errors, which may lead only to low overcurrents or current drops in relation to a target state, and the use of an incorrect load unit in a load circuit (for example, incorrect type of proximity switch, and/or incorrectly assigned sensor or actuator, on the supply and/or signal side) are very difficult if at all possible to identify without targeted complex manual troubleshooting or data analysis by a user or by implementing a corresponding application for a self-testing phase of the installation, for example, prior to commissioning.

EP 1 837 971 B1 furthermore discloses an overload protection method, in which an overload state is generated for an output module by which a load is actuated. Here, the load current and load voltage of the load are monitored at sampling intervals and compared with a predetermined load current threshold. Here, ramp-shaped load voltage values are generated for reference purposes based on a starting load voltage and a predetermined load voltage increment size for as long as an overload timer is running and the load current exceeds the load current threshold. Wiring errors in an installation are also very difficult if not impossible to identify using this method.

SUMMARY OF THE INVENTION

In view of the foregoing it is therefore an object of the invention to provide a method for checking load circuits of an installation or of a control system of an installation, via which wiring errors and/or the use of an incorrect load unit in a load circuit of the installation or an incorrectly assigned signal unit is identified easily and without using additional test devices or complex manual searching.

This and other objects and advantages are achieved in accordance with the invention by a method for checking load circuits of a control system of an installation of the type mentioned at the outset, where the control system, in addition to at least two load circuits that each have at least one load unit or one consumer (for example, contactor, solenoid valve, sensor unit, and/or actuator unit), comprises at least one control unit and a clocked power supply. The at least two load circuits, which each contain at least one load unit, are supplied with a supply voltage and/or a supply current by the clocked power supply via at least two output channels, where the at least two output channels may be formed by at least two direct outputs of the power supply or by at least two output branches of an assembly connected to the power supply. The output channels are furthermore actuated via control signals from the control unit. Here, the method in accordance with the invention comprises at least:

- ascertaining reference current values at predefined voltage values of the supply voltage or reference voltage values at predefined current values of the supply current for respectively predefined installation states, where, in a predefined installation state, at least one output channel is activated and the respectively associated load circuit of the control system is supplied with the predefined voltage values by the supply voltage or with the predefined current values by the supply current;
- storing the reference current values ascertained for the predefined installation states or the reference voltage values ascertained for the predefined installation states,
- measuring present current values at the respectively predefined voltage values of the supply voltage or present voltage values at the respectively predefined current values of the supply current on the at least one activated output channel for the respectively presently predefined installation state during a self-testing phase;
- checking whether, in one of the predefined installation states, a departure from a predefined tolerance range exists, when comparing the respectively presently measured current values with the respectively corresponding stored reference current values, by at least one of the predefined voltage values of the supply voltage or where a departure has occurred, when comparing the respectively presently measured voltage values with the respectively corresponding stored reference voltage values, by at least one of the predefined current values of the supply current; and
- displaying the associated load circuit when, in one of the predefined installation states, a departure from the predefined tolerance range by at least one of the predefined voltage values of the supply voltage or by at least one of the predefined current values of the supply current is identified.

The main aspect of the solution proposed in accordance with the invention is that there is thus the possibility of easily performing very accurate detailed measurements in load circuits of an installation or a complex machine or control system belonging to the installation or machine and assessing the wiring and the correctness of the load units connected to the respective load circuit without using a test apparatus (for example, continuity tester, and/or connection tester). Finding hidden wiring errors, so to speak, is made far easier and simpler by the method according to the invention, easily and without a manual search or detailed data analysis performed, for example, by a user.

An error in the wiring of the control system of the installation or machine may lead, in the corresponding load circuit, to a current consumption and thus load current that is changed in terms of absolute value or, in the case of a predefined or injected current, to voltage changes. There may likewise be effects in any load circuit to which a load unit has been incorrectly connected, for example. By way of example, in the case of an incorrectly wired load unit (for example, sensor, and/or actuator), there may be a lower current consumption in the load circuit assigned according to the circuit diagram in comparison with the ascertained reference current values and an increased current consumption in comparison with the ascertained reference current values in any load circuit to which the load unit has been incorrectly connected.

In the method in accordance with the invention, predefined installation states are brought about during a self-testing phase or during a test mode of the installation or machine. Reference current values or reference voltage values have been determined for these installation states and stored as comparison values. An installation state describes an operating state of the installation or machine and may, for example, be brought about by the control unit through appropriate actuation (i.e., activation and deactivation) of the output channels. In other words, in a predefined installation state, at least one load circuit is activated. The at least one associated load unit of the load circuit is supplied with a supply voltage or a supply current by the power supply via the respective output channel, where the supply voltage adopts predefined voltage values or the supply current may be injected. A present current value of the load current in the respectively associated load circuit is then measured in a targeted manner on at least one output channel activated in the presently predefined installation state for each of the predefined voltage values of the supply voltage. Comparing the presently measured current values of the respective installation state with the corresponding reference current values makes it possible to draw conclusions as to correct wiring of the load circuit or of the at least one load unit and possibly as to correct or orderly functionality of the at least one load unit. As an alternative, a present voltage value for each of the predefined or injected current values of the supply current may be determined in a targeted manner in the corresponding load circuit on at least one output channel activated in the presently predefined installation state. Here, the presently measured voltage values of the respective installation state are then compared with the corresponding reference voltage values at the respectively predefined, injected current values of the supply current, and a conclusion is drawn as to the wiring of the respective load circuit from this comparison. For example, incorrect wiring of the load circuit and/or an incorrectly inserted or installed load unit may thus be identified very easily, quickly and possibly automatically—if for example predefined installation states are run through in the form of a test program.

In expedient embodiment of the method in accordance with the invention, for the respectively predefined installation states, reference voltage values are furthermore ascertained and stored for any output channels and thus for any load circuits that are deactivated or switched out in the respectively predefined installation state. Furthermore, during the self-testing phase, present voltage values for the output channels deactivated and load circuits switched out in the respectively present installation state are measured and then compared with the corresponding reference voltage values for the respective installation state. If, in the comparison between measured voltage values and corresponding reference voltage values for the respective installation state, there is a departure from a predefined tolerance range, then the corresponding load circuit is displayed. Measuring a voltage on a deactivated or switched-out load circuit likewise makes it possible to easily assess and test the correctness of the wiring of the installation or machine or of the associated control system. By way of example, voltage values measured on deactivated output channels or output branches of a predefined installation state may thus be an indication of incorrect wiring in the corresponding load circuit.

In addition, it may be expedient, for respectively predefined installation states as well, for reference current values to be ascertained and stored for at least any output channels that are deactivated in the respectively predefined installation state. During the self-testing phase, present current values are then measured for any output channels that are deactivated in the respective installation state, and compared with the corresponding reference values. The respective load circuit for which there is a departure from a predefined tolerance range in the comparison between measured current values and in each case corresponding stored reference current values is then displayed. A current flow in a load circuit deactivated in the respective installation state may additionally also be used to identify incorrect wiring or to assess a correct function of the respective load circuit or the control system of the installation or machine.

The reference current values and the reference voltage values for the respective installation states may ideally be ascertained, for example, during a planning and development phase of the installation or machine via a reference installation, for example, at the manufacturer. This thus provides, for example, when commissioning installations or machines of the same type (for example, serial installation/machine) at the respective usage location, reference current values and possibly reference voltage values that may be used for a check as to whether the load circuits are wired correctly and whether the correct load units have been installed on the respectively planned sites or in the planned load circuits.

As an alternative or in addition, the reference current values and the reference voltage values for the respective installation states may be ascertained during a commissioning phase of the installation to be checked (for example, during test commissioning at the manufacturer) or be derived from current values and voltage values that are measured, for example, continuously on the respective output channels during ongoing operation of the installation or machine for different installation states. In other words, the reference values are ideally derived from earlier measured values that were measured in different installation states (for example, during ongoing operation, during commissioning at the manufacturer or at the user). This is expedient in particular when an installation or machine, for example, is partially disassembled, transported and reinstalled. In the case of recommissioning or reactivation, it is then possible to very easily check for correct wiring of the load circuits of the installation or machine control system or a correct function of the load circuits.

In a further expedient embodiment of the method in accordance with the invention, reference values of parameters and/or signals at inputs of the control unit are acquired and stored for respectively predefined installation states and present values of the parameters and/or signals at the inputs of the control unit are queried and compared with the corresponding reference values for the respectively predefined installation states during the self-testing phase. If the comparison between present values of the parameters and/or signals and each of the corresponding stored reference values of the parameters and/or signals reveals that there is a departure from a predefined tolerance range, then the respective load circuit may be displayed. Such parameter values and/or signal values may be, for example, values at a temperature sensor value, a proximity switch quiescent signal, a rotational speed sensor value, vapor pressure value, and/or function signal. Errors in the wiring of the installation or machine are thereby additionally able to be identified very easily.

It is advantageous for the predefined tolerance range for a comparison between presently measured current and/or voltage values and the corresponding reference current values and/or reference voltage values to be able to be adapted. The ability to set the tolerance range may ideally make it possible to compensate for fluctuations in the current and/or voltage measurement or even slight drifts, in order, for example, to avoid unnecessary alarms. Regularly performing the method in accordance with the disclosed embodiment of the invention makes it possible, for example, to identify typical fluctuations in load circuits of the installation or the machine and adapt the tolerance range accordingly, in order, for example, to avoid pseudo-errors caused by a tolerance range that is selected to be too narrow or overlooking errors caused by a tolerance range that is selected to be too wide.

The predefined tolerance range may, for example, be specified as a percentage or as an absolute range. A combination of both is also possible. A tolerance range may furthermore be predefined for all load circuits to be checked, or specific tolerance ranges may also be predefined for the respective load circuits.

Ideally, the respective installation states and thus the respectively activated and deactivated output channels (i.e., the activated or deactivated outputs of the power supply or the externally connected in each case activated and deactivated output branches) and the voltage values for the supply voltage of the respective output channel or the current values for the supply current of the respective output channel are predefined by the control unit. The control unit, which may, for example, comprise a programmable logic controller (PLC), a microcontroller or an industrial PC, makes it possible to actuate at least a multiplicity of the load units (i.e., activate and deactivate them in a targeted manner). Defined, predefined installation states can thereby be created very easily by the control unit, in which states, for example, individual load units or load circuits are active and the rest of the load units of the control system are deactivated. The control unit may also have a data connection to the power supply. Control signals for setting predefined installation states may thereby be forwarded by the control unit to the clocked power supply. The clocked power supply then, for example, activates and deactivates the corresponding output channels or output branches and thus the connected load circuits and load units in accordance with the predefined installation state. In addition, the voltage values for the supply voltage or current values for the supply current in the respective installation state may be predefined for the power supply by the control unit or set on the externally connected output branch.

Expediently, provision is made for a predefinable waiting time between changing the predefined voltage value of the supply voltage or the predefined current value of the supply current in the respectively predefined installation state and ascertaining the reference current value or reference voltage value like the present current measured value for this predefined voltage value of the supply voltage or the present voltage measured value for this predefined current value of the supply current. Influences of fluctuations in the power consumption or in the voltage, which occur due to the connection of the supply voltage to the respective load circuit (i.e., activation of the corresponding output channel) or due to the changing of the voltage value of the supply voltage or due to the change in the current value of the supply current owing to the respective load units in the load circuits, on the measurement of the respective reference values or the present measured values (current or voltage) may thereby easily be eliminated as far as possible, for example. The predefinable waiting time may, for example, be selected such that a stable current value has been reached for the measurement of the current values in the respective load circuit, which current value, for example, has a relatively low fluctuation (for example, 3% deviation in one second). A predefined value for the predefinable waiting time for the respective load circuits or the corresponding load units may, for example, be determined while ascertaining the reference values for current or voltage and then used in the self-testing phase. It is thus possible, for example, to reduce waiting times for load units or load circuits without noteworthy settling time to a minimum. In the case of load units with relatively large settling times, a safety reserve may also, for example, be provided for the predefinable waiting time in order to obtain stable measured values.

It is furthermore also conceivable to form a reference current value and/or present current measured value as an average from multiple current measured values that are measured over a predefinable integration time (for example, 0.1 seconds, 10 seconds), or to provide another kind of mathematical filtering in order to reduce the influence of current consumption fluctuations (particularly in the case of changes in the supply voltage) in the load circuit or noise when ascertaining the current measured values. In addition, when the reference current values are recorded for a first time, a settling process during the changing of the supply voltage (i.e., activation of the supply voltage in the respective load circuit or changing of the voltage value of the supply voltage) may be jointly ascertained. The temporal change or the settling process may, for example, be characterized based on a time sequence of the reference current values or a profile storage, as a result of which, for example, it is possible to depict a temporal reference current profile of the settling process. A similar procedure (for example mathematical filtering) is also conceivable when ascertaining the reference voltage values, such as the present measured values of the voltage, in order to reduce or to eliminate settling processes, for example, when connecting or changing the supply current.

It is furthermore advantageous for the predefined voltage values for the supply voltage to be raised in predefined voltage increments from a starting supply voltage (for example, 0 volts) up to a predefined rated voltage (for example, 28 volts) or an operating limit of the at least one load circuit unit connected to the respective load circuit. Increasing the supply voltage in predefined voltage increments (for example, in steps of 2 volts) makes it possible, for example, to measure load circuit-specific current values and/or current values typical for the respective load unit, these offering additional support when finding wiring errors and any malfunctions. Thus, for example, small sensors may have a linear regulator with internal electronics, via which the sensor is activated only starting from a particular supply voltage (for example, 5 volts or 12 volts) and that keeps a current consumption constant, for example, up to a particular voltage (for example, 28 volts). Higher-power consumers, such as control units, have for example a step-down converter, for generating an internal auxiliary voltage and reduce the current as the supply voltage increases. A contactor as load unit has, for example, a current consumption that increases linearly as the supply voltage increases. A DC current motor may, for example, have a very low resistance at a low voltage and, for example, consume a high current that, for example, rises in a flat curve or may even drop as rotational movement begins.

As an alternative to increasing the supply voltage on the at least in each case one activated output channel of the power supply incrementally or in a stepwise manner, it may also be expedient for the predefined voltage values for the supply voltage to be raised in the form of a linear voltage ramp having a predefined gradient from a starting supply voltage (for example, 0 volts) up to a predefined rated voltage (for example, 28 volts) or an operating limit of the at least one load circuit unit connected to the respective load circuit. In addition, in this case, it is also possible to predefine a rise rate of the supply voltage. The current values in each at least one active load circuit of the respective installation state are then measured synchronously with the rise in the supply voltage. In order, for example, to speed up a run-through time of the method, different rise rates may be selected, for example, based on the respective load unit or the respective load units in the load circuit for different voltage ranges of the supply voltage. If, for example, it is known that a consumer or a load unit is activated only in a voltage value range from 14 to 16 volts supply voltage in a load circuit, then the voltage value range up to 14 volts may, for example, be run through more quickly (i.e., with a higher rise rate). For the voltage value range starting from 14 volts, for example, a lower rise rate is then, for example, selected, in order, for example, to ascertain an actual activation voltage of the load unit, to determine the corresponding current measured values and to be able to identify any wiring errors.

The ascertained reference current values and the possibly ascertained reference voltage values may be stored in the control unit of the installation or machine control system. The method in accordance with the disclosed embodiments of the invention may thereby be performed by the control unit, such as in the form of a test program. In addition to predefining the installation states to be run through, the control unit may also, for example, test whether sensor units installed in load circuits return measured values upon activation of the respective load circuit. Such measured values or sensor signals may be stored in addition to the reference current values and/or voltage values and offer an additional option for checking for correct wiring or correct operation, especially of sensor units in the control system, in the self-testing phase of the installation or machine.

As an alternative or in addition, the ascertained reference current values and the possibly ascertained reference voltage values may be transmitted to an evaluation and/or data processing unit (usually in the form of a central or superordinate unit) and stored there. The reference values may thus be used very easily to check multiple types of structurally identical installations or machines.

It is furthermore expedient for the predefined installation states to be selected via the evaluation and/or data processing unit. It is thereby, for example, easily possible to create a test program for the self-testing phase of the installation or machine that is run through, for example, during commissioning at the user of the installation or machine. During the selection, it is thus possible to remove from the test program or not to select installation states that have proved not to be useful for the check due to repeated run-throughs of the test program. The run-through of the check may thereby be sped up, since, for example, only relevant installation states can be selected. In addition, a list of installation states (such as activation of a pump or of valves) may, for example, already be predefined for the selection, these for example not containing unhelpful, dangerous or undesirable installation states, or these installation states may ideally be excluded during the selection.

The presently measured current values and the possibly measured voltage values for the respective installation state may then likewise be forwarded to the evaluation and/or data processing unit and stored there. Storing the present measured values very easily allows expanded analysis and evaluation possibilities. Measured results may also very easily be displayed graphically or temporal evolutions in the installation or machine may be assessed. Imminent malfunctions in load circuits or changes that may lead to malfunctions of the installation or machine are thereby, for example, able to be identified in a timely manner.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained below by way of example with reference to the appended figures, in which.

DETAILED DESCRIPTION OF THE EXEMPLARY EMBODIMENTS

Figure 1:
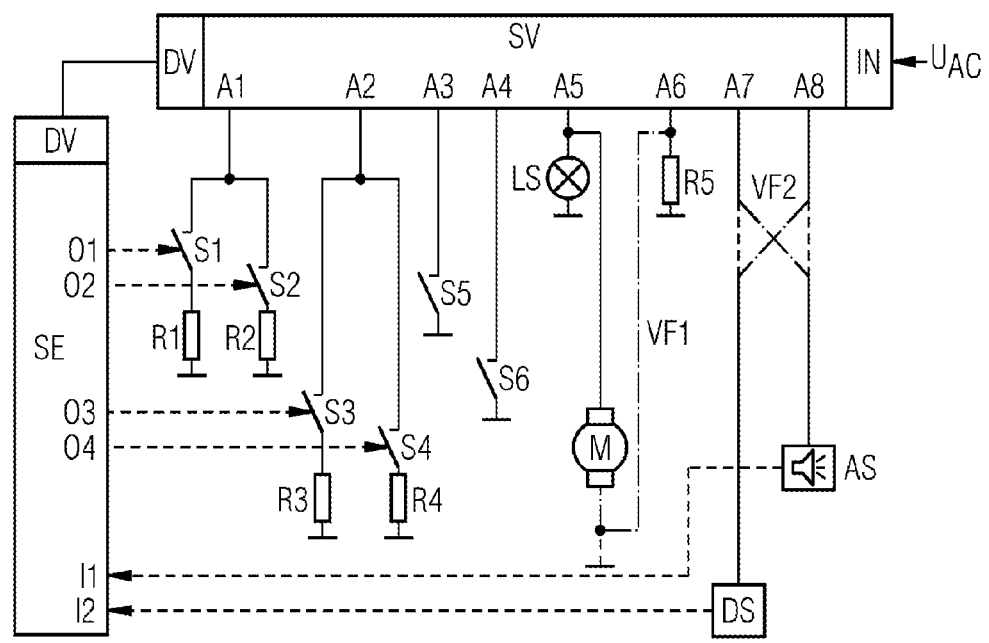
FIG. 1 shows a schematic and exemplary structure of a control system of an installation for performing the method for checking load circuits in accordance with the invention.

FIG. 1 schematically shows a control system of a technical installation or a complex machine by way of example. Here, the exemplary control system comprises at least one control unit SE, which may, for example, comprise a programmable logic controller (PLC). As an alternative, a microcontroller or an industrial PC may also be used as control unit SE. The control unit SE has, for example, digital outputs O1, . . . , O4 for actuating load units (e.g., for switching of the switching units S1, . . . , S4). As an alternative, the switching units S1, . . . , S4 may also be part of an output assembly of the control unit SE, in particular a digital output assembly having a programmable logic controller or PLC. As an alternative or in addition, the control unit SE may also have analog outputs, to which actuator units or switching units may be connected, for example. In FIG. 1, for the sake of simplicity, the analog outputs of the control unit SE are not illustrated explicitly. The digital outputs O1, . . . , O4 and the analog outputs offer the control unit SE the possibility of actuating the installation or machine primarily during operation and thus of regulating or creating operating states of the installation or machine. The control unit SE furthermore has, by way of example, digital inputs I1, I2, via which signals can, for example, be received from load units (in particular sensor units DS, AS). Signals received via the inputs I1, I2 may inform the control unit SE about the current scene in the installation or machine and, for example, particular control and regulation processes may be triggered. The control unit SE may also have analog inputs for connecting to and querying sensor units.

The exemplary control system furthermore comprises for example a clocked power supply SV, which is connected to a supply voltage $U_{AC}$ (for example, a 3-phase AC voltage) via an input side IN. The power supply SV has for example eight outputs and thus eight output channels A1, . . . , A8, to which the load circuits of the control system are, for example, directly connected and via which the load circuits of the control system of the installation or the machine are supplied with a supply voltage (for example, 24 V DC voltage) or with a supply current by the power supply SV. The power supply SV may, for example, offer the option, like for example the SITOP PSU8600, that the voltage value of the supply voltage delivered to the load circuit and the current are able to be set and monitored individually for each output channel A1, . . . , A8.

As an alternative, the control system may, for example, also have a power supply SV, to which, for example, an external assembly (for example, an externally connectable fuse unit) having at least two output branches is connected, which then form the at least two output channels A1, . . . , A8 for the power supply SV. These output branches or output channels A1, . . . , A8 are, for example, separately connectable and the voltage values of the supply voltage delivered to the load circuit, like the current, may be set and monitored individually. The respective load circuits or the load units associated with the load circuits are then supplied with current or voltage via the output channels A1, . . . , A8.

In the control system illustrated by way of example in FIG. 1, a supply voltage delivered into the respective load circuit for the respectively associated output channel A1, . . . , A8 is predefined, and the respective current received by the at least one load unit in the respective load circuit thus forms a variable to be measured for the reference values and for the present measured values for a respective installation state. As an alternative thereto, the power supply SV or at least one output channel A1, . . . , A8 of the power supply SV may, for example, be operated as a current source. Here, a supply current or load current is predefined or injected for the respective output channel A1, . . . , A8 as predefined value. A voltage for the reference values is then determined or measured as present measured value for the respective installation state, where the voltage can be set based on an impedance of the respective load unit in the load circuit and possibly measured with higher accuracy, or can be measured more easily in the case of loads with a capacitive component or with capacitors.

The power supply SV and the control unit SE of the control system may furthermore have interface modules DV, via which a, for example, bidirectional data connection for transmitting control signals and data information may be created. By way of example, a Process Field Network (Profinet), which is an open industrial Ethernet standard of the PROFIBUS user organization, may be used for the data connection.

For a voltage supply of the control unit SE (as illustrated by way of example in FIG. 1) provision may be made for a dedicated power supply, this not being illustrated in FIG. 1.

As an alternative, the corresponding supply voltage may also be made available to the control unit SE by the clocked power supply SV of the control system. For this purpose, the control unit SE could, for example, be connected to a first output channel A1 of the power supply SV.

The load circuits of the control system of the installation or machine are connected to the output channels A1, ..., A8 and may each have at least one load unit, for example, at least one actuator unit or switching unit or sensor unit. In the control system illustrated by way of example in FIG. 1, switching units S1, S2, S3, S4 and associated load resistors R1, R2, R3, R4 are, for example, connected to the first output channel A1 and to a second output channel A2, which load resistors can be switched in or switched out via the respective switching unit S1, S2, S3, S4 and through actuation by the respective digital outputs O1, O2, O3, O4 of the control unit SE. Further actuator units or switching units S5, S6 (for example, contactors, and/or solenoid valves), such as for activating or deactivating an electric valve, and/or a motor or a module for drive control, are likewise connected to a third and fourth output channel A3, A4 as load units. These actuator and switching units S5, S6 may, for example, be actuated by the control unit SE of the control system or another control unit.

By way of example, a light signal LS and a motor M, for example, for operating a fan unit, are connected to a fifth output channel A5 of the power supply SV. By way of example, a further load resistor R5 is connected to a sixth output channel A6 of the power supply SV. In this case, for example, the motor M or the fan unit is incorrectly not connected to ground by the fifth output channel A5 (as illustrated by way of a dashed line) but rather connected, due to a first wiring error VF1 (for example, when setting up the installation or the machine), to the sixth output channel A6. The first wiring error VF1 is in this case illustrated as a dot-and-dash line.

A further, second exemplary wiring error VF2 is illustrated in the wiring of a seventh and eighth output channel A7, A8 of the power supply SV. A respective sensor unit DS, AS is connected to the seventh and eighth output channel A7, A8, for example, as load unit, and delivers, for example, an input signal to the corresponding digital input I1, I2 of the control unit SE. In the case of correct wiring (again illustrated by way of a dashed line) a pressure sensor DS would be connected to the seventh output channel A7, for example, which pressure sensor reports an input signal to the digital input I2 of the control unit SE upon reaching a threshold value, and an acoustic signal unit AS is connected to the eighth output channel A8 and outputs a function signal to the digital input I1 of the control unit SE during operation. Due to the second wiring error VF2 (as illustrated as a dot-and-dash line) the connection of the two sensor units DS, AS has been interchanged, as a result of which the acoustic signal unit AS now receives the corresponding supply voltage via the seventh output channel A7 and the pressure sensor DS receives the corresponding supply voltage via the eighth output channel A8. The respective signal outputs of the pressure sensor DS or the acoustic signal unit AS are however connected to each correct digital inputs I1, I2 of the control unit SE.

Figure 2:
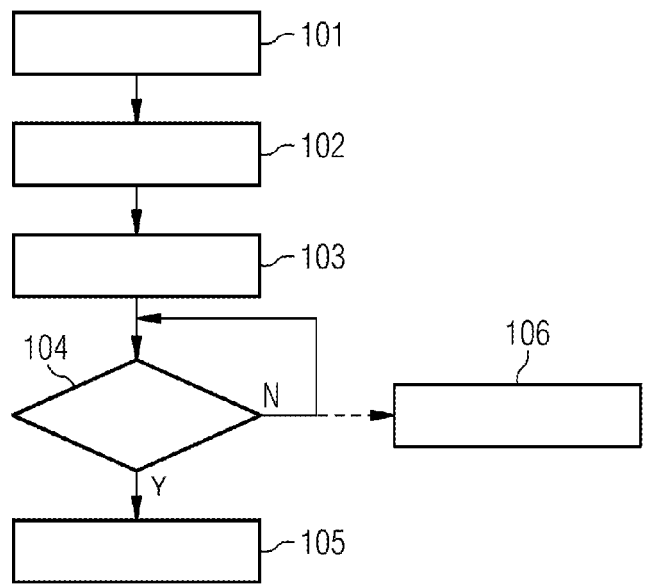
FIG. 2 shows an exemplary flowchart of the method for checking load circuits of a control system in an installation in accordance with the Invention.

FIG. 2 shows, by way of example, a flowchart of the method in accordance with the invention for checking load circuits in an installation or a control system of an installation, as illustrated by way of example in FIG. 1.

When performing the method in accordance with the invention, installation states are predefined in particular in a reference value ascertainment step 101 for ascertaining reference current and possibly reference voltage values in the respective output channels A1, ..., A8 of the power supply SV and in a measuring step 103, in which present current values on and possibly present voltage values in the respective output channels A1, ..., A8 of the power supply SV are determined. These installation states are, for example, brought about via control commands from the control unit SE, via which output channels A1, ..., A8 of the power supply SV are activated or deactivated by the power supply SV itself, for example, and outputs O1, ..., O4 of the control unit SE are possibly activated or deactivated. In addition, for predefined installation states, inputs I1, I2 of the control unit SE may also be queried, for example, for present parameter values or signal values by sensor units DS, AS.

A predefined installation state is in this case considered to be an operating case of the installation or machine that is defined or brought about via a switch position by the control unit SE and activated load circuits, i.e., load circuits supplied with supply voltage. In other words, for an installation state, at least one of the output channels A1, ..., A8 of the power supply SV becomes active or is activated and the associated load circuit is supplied with a voltage by the power supply SV. In addition, provided that the load circuit switched to active has a load unit S1, ..., S4 actuated by the control unit SE, the corresponding output O1, ..., O4 of the control unit SE may be activated or, if the load circuit switched to active has a sensor unit DS, AS, the corresponding input I1, I2 of the control unit may be queried. Such inputs (for example, temperature values, rotational speed values, vapor pressure values, and/or function signals) may, for example, additionally be used to check the load circuit, i.e., in particular correct wiring of a sensor unit DS, AS. There are thus particular switch settings and parameters for the respective installation state, in particular in the control unit SE. In order to ascertain reference values and present measured values of current and voltage in a load circuit, installation states are ideally predefined in which, for example, only one output channel A1, ..., A8 and, for example, only one output O1, ..., O4 of the control unit SE are activated at the same time, provided that the corresponding load circuit has a load element S1, ..., S4 actuated by the control unit SE.

For the control system, illustrated by way of example in FIG. 1, of a technical installation or machine that is intended to be checked by the method in accordance with the invention, it is thus possible, for example, to define at least twelve functional installation states and possibly predefine them in the form of a test program, for example. For these twelve functional installation states, for example, control commands, which are transmitted by the control unit SE to the power supply SV via the data connection DV, may be used to activate each case one of the eight output channels A1, ..., A8. In addition, each one of the digital outputs O1, ..., O4 of the control unit SE is activated in order to activate the associated switching unit S1, ..., S4 when the corresponding first or second output channel A1, A2 of the power supply SV is activated. In other words, for an exemplary first installation state, the first output channel A1 is activated and the rest of the output channels A2 to A8 remain deactivated. Then, for an exemplary second installation state, following activation of the first output channel A1, the first digital output O1 of the control unit SE may additionally be activated in order to connect the first switching unit S1 in the load circuit connected to the first output channel A1 and to switch in the associated load resistor R1. For an exemplary third installation state, the first output channel A1, for example, remains activated and the rest of the output channels A2, ..., A8 of the power supply SV remain deactivated. However, the first digital output O1 of the control unit SE is now deactivated (i.e., the associated load resistor R1 is switched out) and the second digital output O2 of the control unit SE is activated to connect the second switching unit S2 in the load circuit connected to the first output channel A1 and to switch in the associated load resistor R2. Corresponding installation states may, for example, also be predefined for the second output channel A2 of the power supply in the installation illustrated by way of example in FIG. 1. In the rest of the installation states, for example, each one of the output channels A3 to A8 of the power supply is activated to supply the associated load circuit with a supply voltage.

In order to reduce the test time, for example, multiple output channels A1, ..., A8 of the power supply SV and/or multiple outputs O1, ..., O4 of the control unit SE may also be activated at the same time. For the control system, illustrated in FIG. 1, of an installation or machine, the second and third installation state described above could, for example, be combined by activating, at the same time, in addition to the first output channel A1 of the power supply SV, the first and the second output O1, O2 of the control unit, connecting the associated switching elements S1, S2 in the load circuit connected to the first output channel A1 of the power supply SV and switching in the associated load resistors R1, R2 at the same time. The installation states for the second output channel A2 of the power supply SV may also be combined in the same way, for example.

In real installations, considerably more installation states may be defined and used for the method in accordance with the invention. Here, unhelpful, dangerous or non-expedient installation states (for example, an installation state in which a pump or a valve is activated in an undesirable manner) may however be excluded. The predefined installation states or installation states considered to be expedient may furthermore be combined in the form of a test program that can be adapted, for example, for a self-testing phase of an installation or machine that is put into operation by a user, i.e., the installation states may be selected and predefined in a manner specific to the installation and/or specific to the user.

To check the load circuits in an installation pursuant to the method in accordance with the invention, reference current values for a respectively predefined installation state (i.e., in at least one activated output channel A1, ..., A8 of the power supply SV) are ascertained at predefined voltage values for the supply voltage in the reference value ascertainment step 101. In other words, the control unit SE is used, for example, to bring about a predefined installation state (for example, the first installation state with activated first output channel A1 of the power supply SV; the second installation state with activated first output channel A1 and activated first digital output O1 of the control unit SE; etc.). Then, the predefined voltage values for the supply voltage of the associated load circuit are set, for example, by the power supply SV at the at least one activated (for example, the first) output channel A1 of the power supply SV, and the associated current values are ascertained.

As an alternative, in the reference value ascertainment step 101, instead of the reference current values for a respectively predefined installation state (i.e., in the case of at least one activated output channel A1, ..., A8 of the power supply SV) reference voltage values may be ascertained at predefined current values of the supply current. In other words, the control unit SE is, for example, used to create a predefined installation state (for example, the first installation state with activated first output channel A1 of the power supply SV; the second installation state with activated first output channel A1 and activated first digital output O1 of the control unit SE; etc.). Then, the predefined current values for the supply current of the associated load circuit are injected, for example, by the power supply SV at the at least one activated (for example, the first) output channel A1 of the power supply SV, and the associated voltage values are ascertained.

In addition, it is also possible to determine voltage values as further reference voltage values and/or current values as further reference current values on the rest of the output channels A2, ..., A8, which are deactivated in the predefined installation state, and to query the parameter values and/or signal values from the sensor units DS, AS as reference values that are present at the inputs I1, I2 of the control unit SE.

The reference current values may, for example, be taken by way of a reference installation or machine, for example, by a manufacturer in a development test phase (i.e., after, for example, a series installation or machine has been developed). As an alternative or in addition, such as in the case of user-specific installations or machines, the reference current values may be ascertained during initial commissioning of the installation or machine or derived from current values that are measured during ongoing operation on the respective output channels A1, ..., A8 for the predefined installation states. In the same way, reference voltage values for predefined installation states may possibly also be determined on a reference installation or machine or upon initial commissioning of the installation or machine or be derived from voltage values measured continuously during operation.

The reference current values ascertained for the predefined installation states and predefined voltage values of the supply voltage of the respective load circuit are stored in a storage step 102. Here, the reference current values may be stored, for example, in the control unit SE of the control system of the installation or transmitted to the control unit SE of an installation or machine of the same type. As an alternative or in addition, the reference current values may also be transmitted to a, for example, centrally available evaluation and/or data processing unit and stored there. If, as an alternative, reference voltage values at predefined current values of the supply current in the respective load circuit or, in addition, further reference voltage values at deactivated output channels A1, ..., A8 are determined for the predefined installation states, then these may likewise be stored in the control unit SE. As an alternative or in addition, the reference voltage values may also be transmitted to the evaluation and/or data processing unit and stored there together with the corresponding reference current values. In other words, in storage step 102, at least one reference current value for each predefined voltage value of the supply voltage in the respective load circuit or a reference voltage value for each predefined current value of the supply current in the respective load circuit is stored for each predefined installation state.

In measuring step 103, a self-testing phase is started on the respective installation or machine to be checked, which may be run through upon commissioning, for example, following transportation and reinstallation or new installation of the respective installation or machine, or else upon a restart during ongoing operation of the installation or machine. In measuring step 103, the control unit SE, for example, by way of commands to the power supply SV via the data connection DV and possibly via signals on the outputs of load units S1, . . . , S4 connected to the control unit SE, brings about the predefined installation states in a targeted manner. The predefined installation states may, for example, be selected from a list of possible installation states or installation states expedient for the installation or machine. This list may, for example, be created before or during the reference value ascertainment step 101 and stored, for example, in the control unit SE or in the evaluation and/or data processing unit.

Furthermore, in measuring step 103, the predefined voltage values of the supply voltage on each at least one activated output channel A1, . . . , A8 of the power supply are predefined for each predefined installation state, such as by the power supply SV via a command from the control unit SE. For each predefined voltage value of the supply voltage, a present current value is then measured on each at least one activated output channel A1, . . . , A8 of the power supply SV and stored. In other words, a present current value is obtained for each predefined installation state at each predefined voltage value of the supply voltage and can then be evaluated in relation to the corresponding reference current value.

In order to run through the predefined voltage values of the supply voltage for the respectively presently predefined installation state in measuring step 103, the supply voltage may, for example, be raised from a starting supply voltage (for example 0 volts) in predefined voltage increments (for example, 2 volts) up to a predefined rated voltage (for example, 24 or 28 volts). As an alternative, the supply voltage may also be raised in the form of a linear voltage ramp with a predefinable gradient or rise rate from a starting supply voltage (for example 0 volts) up to a predefined rated voltage (for example 24 or 28 volts), and predefined voltage values of the supply voltage may thereby be run through. If the predefined voltage value of the supply voltage on the at least one activated output channel A1, . . . , A8 of the power supply SV is changed either incrementally or via a ramp-shaped rise to a next predefined voltage value, then there may be provision for a predefined waiting time between changing the voltage value of the supply voltage and measuring the present current value in the at least one activated output channel A1, . . . , A8 of the power supply SV. Current fluctuations caused by settling processes due to the voltage change, etc., are thereby, for example, not jointly measured, but rather a present current value that is as static or as constant as possible is measured. Provision may furthermore be made to average measured values over a predefinable integration time (for example, 0.1 or 10 seconds) or different mathematical filtering to reduce current fluctuations and/or noise when ascertaining the present current values. The filtering operations may also occur over multiple current measurements performed in a predefined order to ascertain measured values that are filtered over a predefinable time period (for example, 1 minute) at predefinable intervals (for example, every 10 seconds), and thereby to be able to describe a settling process of a load unit or of a consumer.

In order to ascertain the reference values of current or voltage, in reference value ascertainment step 101, the above-described methods for changing the predefined voltage values of the supply voltage on the at least one active output channel A1, . . . , A8 may likewise be applied in the respectively predefined installation state. Here, provision may likewise be made for a waiting time between changing the voltage value of the supply voltage and ascertaining the reference current value or between changing the current value of the supply current and ascertaining the reference voltage value, or a filtering method may be applied to reduce fluctuations and/or noise, for example, caused by settling processes. It should be borne in mind in this case that the same methods for changing the voltage of the voltage value of the supply voltage and for reducing current fluctuations (for example, waiting time, mathematical filtering, and/or multiple measurements in a predefined order over a predefinable time period at a predefined interval) may be used in measuring step 103.

In addition, present voltage values on the output channels A1, . . . , A8 of the power supply SV that are activated in the respectively predefined installation state may also be measured in measuring step 103. It is also possible to measure present current values on any output channels A1, . . . , A8 of the power supply SV that are deactivated in the respectively predefined installation state. These presently measured voltage and current values are also stored and may be used to evaluate and check the load circuits of the installation or machine.

As an alternative, in measuring step 103, instead of the present current value, the present voltage value on the at least one activated output channel A1, . . . , A8 may be measured for the respectively predefined installation state. For this purpose, for the respectively predefined installation state, the predefined current values of the supply current are injected on each at least one activated output channel A1, . . . , A8, such as by the power supply SV via a command from the control unit SE. For each predefined current value of the supply current, a present voltage value is thus measured on each at least one activated output channel A1, . . . , A8 of the power supply SV and stored. In other words, a present voltage value is obtained for each predefined installation state at each predefined current value of the supply current and can then be evaluated in relation to the corresponding reference voltage value. In order to ascertain the present measured values of the voltage, the above-described methods for changing the predefined current values of the supply current on the at least one active output channel A1, . . . , A8 in the respectively predefined installation state may likewise be applied, and corresponding filtering methods or a waiting time may be applied in order to wait out settling processes and to reduce noise.

The current values or voltage values presently measured on the at least one active output channel A1, . . . , A8 of the power supply SV and the voltage values possibly measured on the non-active output channels A1, . . . , A8 of the power supply SV may, for example, likewise be stored in the control unit SE, which then also, for example, performs an evaluation. The measured current values and voltage values may however also be forwarded to the evaluation and/or data processing unit and stored there. The evaluation is then, for example, likewise performed by the evaluation and/or data processing unit.

In a test step 104, for each predefined installation state, the presently measured current values that were ascertained for the respective predefined voltage values of the supply voltage on the at least one activated output channel A1, . . . , A8 of the power supply SV for the respectively predefined installation state are then compared with the corresponding reference values. In this case, the reference current values ascertained in reference step 101 for each same installation state and for the corresponding voltage values of the supply voltage are used. In the comparison between presently measured current values and the corresponding reference values, a check is performed to determine whether a predefined tolerance range is exceeded in the presently checked predefined installation state by one of the predefined voltage values of the supply voltage on the at least one active output channel A1, . . . , A8 or in least one active load circuit of the installation state under test. If, in measuring step 103, present voltage values were measured instead of present current values, then, in test step 104, these are compared with the corresponding reference voltage values ascertained in reference step 101, and compliance with the predefined tolerance range is checked.

The predefined tolerance range may in this case, for example, be indicated as a percentage or as an absolute range. Here, a tolerance range may be provided for all load circuits to be tested of the installation or machine. However, it is also possible to individually predefine tolerance ranges in a load circuit-specific manner or to provide tolerance ranges, for example, for load circuits of identical or similar design. The tolerance range may furthermore be adapted if, for example, it is identified, in the course of the method in accordance with the invention or when applying it multiple times, that the predefined tolerance range has been selected to be too narrow or too wide, for example. A tolerance range that is selected, for example, to be too narrow may, for example, produce pseudo-errors caused by fluctuations in load circuits and/or signs of aging of load units, for example. In other words, an error is indicated in a load circuit despite the correct installation function. In the case of a tolerance range that is selected to be too wide, wiring errors and/or functional errors of load units that are actually present may, for example, be overlooked. The predefined tolerance range may, for example, be adapted based on measured current values stored at different times in the load circuits.

If it is identified, in test step 104, that the tolerance range is not complied with in the presently checked predefined installation state at least at one predefined voltage value of the supply voltage on the at least one activated output channel A1, . . . , A8 of the power supply SV from the comparison between presently measured current value and corresponding reference current value, then the load circuit connected to the at least one activated output channel is displayed in a display step 105. The respective load circuit may, for example, be displayed via the control unit SE. For this purpose, use may be made, for example, of a display unit (for example, display, and/or mobile display unit) assigned to the control unit SE. The same applies when, instead of a current, a voltage for the respective installation state is measured in the load circuit respectively switched to active.

When performing test step 104 on an evaluation and/or data processing unit, the display of the respective load circuit in which a wiring error is suspected due to the measured present current values may occur in display step 105, such as via an output unit of the evaluation and/or data processing unit. Here, for example, the measured values of current or voltage and/or the comparison with the reference current or voltage values may be prepared graphically (for example in the form of tables, and/or curves). In the case of evaluation by an evaluation and/or data processing unit, previously stored current or voltage measured values of the load circuits, for example, in comparison with the presently measured current or voltage measured values of the load circuits, may furthermore also be output and displayed on an output unit in a graphically prepared manner.

If, in test step 104, in the presently checked predefined installation state, no departure (i.e., absolute or percentage exceedance or drop below) from the predefined tolerance range is identified through the comparison between the respectively presently measured values and the corresponding reference values, then a next predefined installation state is checked, this having been predefined for the installation or machine to be checked and for which presently measured values and reference values are available. If, in one of the further predefined installation states, a departure from the predefined tolerance range or the tolerance ranges predefined, for example, in a load circuit-specific manner is identified through the corresponding comparisons of presently measured values with the corresponding reference values, then the respective load circuits may likewise be displayed in display step 105. If, in the further predefined installation states, no exceedances of the tolerance range or the tolerance ranges predefined, for example, in a load circuit-specific manner occur resulting from the corresponding comparisons of presently measured values with the corresponding reference values either, then the method according to the invention is ended in a terminating step 106. There may, for example be, an output in terminating step 106 that no abnormalities could be identified in the checked load circuits of the installation or machine.

In addition, provided that they were measured in measuring step 103, the voltage values presently measured on the output channels A1, . . . , A8 of the power supply SV that are deactivated in the respective installation state may also be compared with corresponding reference voltage values, in test step 104. If, in test step 104, a voltage value is identified on an output channel A1, . . . , A8 that is deactivated for the predefined installation state to be checked, which voltage value exceeds the reference voltage value (for example 0 volts) by more than the predefined tolerance range, then this may likewise indicate an error in the wiring of the installation or machine or the associated control system. The corresponding load circuit may then be displayed again in display step 105.

Current values presently measured on the output channels A1, . . . , A8 of the power supply SV that are deactivated in the respective installation state may furthermore also be considered in test step 104 in order to find wiring and/or functional errors in the installation or the load circuits.

In the installation or machine illustrated by way of example in FIG. 1, in a run-through of the self-testing phase, which comprises at least the measuring step 103, the test step 104, the display step 105 and the terminating step 106, in the correspondingly predefined installation states, the two exemplary wiring errors VF1, VF2 would be identified. For instance, in test step 104, in a predefined installation state in which at least the fifth output channel A5 of the power supply SV is activated, it would be identified that, for example, a comparison of the presently measured current values and the possibly presently measured voltage values with the corresponding reference values lies outside the predefined tolerance range. The comparison departs from or exceeds the tolerance range, for example, in absolute terms or as a percentage, because, for example, the motor M or the fan unit is incorrectly not connected directly to ground by the fifth output channel A5, but rather is connected to the sixth output channel A6 due to the first wiring error VF1 (for example, when installing the installation or machine) and, when the fifth output channel A5 of the power supply SV is activated, a current is also fed into the load circuit connected to the sixth output channel A6. In other words, in measuring step 103, current values that deviate (for example, lower) from the corresponding reference current values are measured, for example, on the fifth output channel A5 of the power supply, as a result of which the predefined tolerance range may be exceeded in absolute terms or as a percentage from the comparison with the corresponding reference values, for example. Furthermore, voltage values or current values are measured for example on the sixth (deactivated) output channel A6 in measuring step 103, which values would not be measured in the case of correct wiring on the sixth output channel A6. It is then possible to identify a departure from the one or more tolerance ranges for this installation state (that is to say at least activated fifth output channel A5 of the power supply SV) in test step 104, and the load circuit connected to the fifth output channel A5 of the power supply SV may be displayed as incorrect in display step 105.

In the same way, in the case of corresponding installation states, for example, an installation state in which, for example, only the seventh output channel A7 of the power supply SV is activated, and an installation state in which for example only the eighth output channel A8 of the power supply SV is activated, it may be identified in the self-testing phase of the installation or the machine that a further, second wiring error VF2 is present here, in which the connection of the two sensor units DS, AS has been interchanged. This wiring error or the corresponding load circuits may then likewise be displayed in display step 105.

If the measured current values measured in the installation state with the seventh and eighth active output channel A7 and A8 should have a slight difference from the corresponding reference current values, such that the comparison lies within the one or more respectively predefined tolerance ranges, then the respectively incorrect load unit or sensor unit DS, AS is activated by the incorrect wiring of the second wiring error VF2. In other words, the function signal emitted by the acoustic sensor unit AS then becomes temporally visible for the control unit SE as input signal, when the pressure sensor DS should actually be activated, and vice versa. An additional evaluation of a temporal association of input signals to the respective installation states in test step 104 may nevertheless thus be used to identify the second wiring error VF2. It is therefore advantageous to select sensor units DS, AS that already transmit a quiescent signal to the corresponding input I1, I2 of the control unit SE when a supply voltage is already present in the respectively associated load circuit (for example, 4 to 20 mA current loop, and/or active high signal in the quiescent state). It is thereby possible, for example, to very easily identify whether the correct sensor unit and/or actuator unit is supplied, or it is thereby also possible to identify a potential cable breakage in a load circuit.

It is furthermore noted that the method in accordance with the invention may be used not only in the case of clocked power supplies SV by which an AC voltage applied at input is converted into a constant output DC voltage. The method in accordance with the invention may, for example, be applied in the case of regulated voltage supplies for AC current load units as well, and thus for a wide range of consumers for checking correct wiring and operation of these load units.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for checking load circuits of a control system of an installation, the method comprising:
    ascertaining reference current values at predefined voltage values of supply voltage or reference voltage values at predefined current values of a supply current for respectively predefined installation states, in a predefined installation state, at least one output channel being activated and a respectively associated load circuit being supplied with the predefined voltage values by the supply voltage or with the predefined current values by the supply current;
    storing the reference current values ascertained for the predefined installation states or the reference voltage values ascertained for the predefined installation states;
    measuring present current values at the respectively predefined voltage values of the supply voltage or present voltage values at the respectively predefined current values of the supply current on the at least one activated output channel for the respectively predefined installation states during a self-testing phase;
    checking whether, in one of the predefined installation states, a departure from a predefined tolerance range occurs, when comparing the respectively presently measured current values with the respectively corresponding stored reference current values, by at least one of the predefined voltage values of the supply voltage or whether, in one of the predefined installation states, a departure from a predefined tolerance range occurs, when comparing the respectively presently measured voltage values with the respectively corresponding stored reference voltage values, by at least one of the predefined current values of the supply current; and
    displaying the corresponding load circuit when, in one of the predefined installation states, a departure from the predefined tolerance range by at least one of the predefined voltage values of the supply voltage or by at least one of the predefined current values of the supply current is identified;
    wherein the control system comprises at least two load circuits, at least one control unit and a clocked power supply via which the at least two load circuits, each having at least one load unit, are supplied with at least one of the supply voltage and the supply current via at least two output channels, control signals being made available by the control unit to actuate the at least two output channels.

2. The method as claimed in claim 1, wherein reference voltage values are furthermore ascertained and stored for at least any output channels which are deactivated in the respectively predefined installation state for respectively predefined installation states;
  wherein present voltage values for the output channels which are deactivated in the respectively present installation state are measured during the self-testing phase;
  wherein the measured voltage values are compared with the reference voltage values for the respective installation state; and
  wherein the respective load circuit in which there is a departure from a predefined tolerance range when comparing between measured voltage values and respectively corresponding stored reference voltage values is displayed.

3. The method as claimed in claim 1, wherein reference current values are furthermore ascertained and stored for at least any output channels that are deactivated in the respectively predefined installation state for respectively predefined installation states;
  wherein present current values for any output channels which are deactivated in the respective installation state are measured during the self-testing phase;
  wherein the measured current values are compared with the corresponding reference current values for the respective installation state; and
  wherein the respective load circuit in which there is a departure from a predefined tolerance range when comparing between measured current values and respectively corresponding stored reference current values is displayed.

4. The method as claimed in claim 2, wherein reference current values are furthermore ascertained and stored for at least any output channels that are deactivated in the respectively predefined installation state for respectively predefined installation states;
  wherein present current values for any output channels which are deactivated in the respective installation state are measured during the self-testing phase;
  wherein the measured current values are compared with the corresponding reference current values for the respective installation state; and
  wherein the respective load circuit in which there is a departure from a predefined tolerance range when comparing between measured current values and respectively corresponding stored reference current values is displayed.

5. The method as claimed in claim 1, wherein the reference current values and the reference voltage values for the respective installation states are ascertained by way of a reference installation.

6. The method as claimed in claim 1, wherein the reference current values and the reference voltage values for the respective installation states are ascertained during a commissioning phase of the installation to be checked or are derived from current values and voltage values measured on the respective output channels during ongoing operation.

7. The method as claimed in claim 1, wherein reference values of at least one of parameters and signals are acquired at inputs of the control unit and stored for respectively predefined installation states, that present values of at least one of the parameters and signals are queried at the inputs of the control unit and compared with the corresponding reference values during the self-testing phase for the respectively predefined installation states; and
  wherein the respective load circuit in which there is a departure from a predefined tolerance range when comparing between present values of at least one of the parameters and signals and the respectively corresponding stored reference values is displayed.

8. The method as claimed in claim 1, wherein the predefined tolerance range is adapted for at least one of (i) the comparison of the present current values with the corresponding reference current values and (ii) the comparison of the present voltage values with the corresponding reference voltage values.

9. The method as claimed in claim 1, wherein the respective installation states and thus the respectively activated and deactivated output channels and the voltage values for the supply voltage of the respective output channels or the current values for the supply current of the respective output channels are predefined by the control unit.

10. The method as claimed in claim 1, wherein a predefinable waiting time occurs between changing the predefined voltage value of the supply voltage or the predefined current value of the supply current in the respectively predefined installation state and ascertaining the present current measured value for this predefined voltage value of the supply voltage.

11. The method as claimed in claim 1, wherein the predefined voltage values for the supply voltage are raised in predefined voltage increments from a starting supply voltage up to a predefined rated voltage or up to an operating limit of the at least one load unit connected to the respective load circuit.

12. The method as claimed in claim 1, wherein the predefined voltage values for the supply voltage are raised as a linear voltage ramp with a predefinable gradient from a starting supply voltage up to a predefined rated voltage or up to an operating limit of the at least one load unit connected to the respective load circuit.

13. The method as claimed in claim 1, wherein the ascertained reference current values and the ascertained reference voltage values are stored in the control unit.

14. The method as claimed in claim 1, wherein the ascertained reference current values and the ascertained reference voltage values are transmitted to and stored in an evaluation and/or data processing unit.

15. The method as claimed in claim 14, wherein the predefined installation states are selected via the evaluation and/or data processing unit.

16. The method as claimed in claim 14, wherein at least one of presently measured current values and voltage values are forwarded to and stored in the evaluation and/or data processing unit.

17. The method as claimed in claim 15, wherein at least one of presently measured current values and voltage values are forwarded to and stored in the evaluation and/or data processing unit.

* * * * *